United States Patent

Heime et al.

[11] Patent Number: 5,772,759
[45] Date of Patent: Jun. 30, 1998

[54] PROCESS FOR PRODUCING P-TYPE DOPED LAYERS, IN PARTICULAR, IN II-VI SEMICONDUCTORS

[75] Inventors: Klaus Heime; Michael Heuken, both of Aachen, Germany

[73] Assignee: Aixtron GmbH, Aachen, Germany

[21] Appl. No.: 727,763

[22] Filed: Oct. 8, 1996

Related U.S. Application Data

[63] Continuation of Ser. No. 403,776, Apr. 11, 1995, abandoned.

[30] Foreign Application Priority Data

Sep. 28, 1992 [DE] Germany .......................... 42 32 504.8

[51] Int. Cl.⁶ .................................................. C30B 25/14
[52] U.S. Cl. ............................ 117/103; 117/108; 438/265
[58] Field of Search .............................................. 438/265

[56] References Cited

U.S. PATENT DOCUMENTS

| | | | |
|---|---|---|---|
| 5,248,631 | 9/1993 | Park et al. | 437/105 |
| 5,274,269 | 12/1993 | DePuydt et al. | 257/744 |
| 5,291,507 | 3/1994 | Haase et al. | 372/44 |
| 5,371,409 | 12/1994 | McCaldin et al. | 257/741 |

FOREIGN PATENT DOCUMENTS

| | | |
|---|---|---|
| 327034 | 8/1989 | European Pat. Off. . |
| 247686 | 11/1986 | Japan . |
| 132699 | 5/1992 | Japan . |
| 251369 | 9/1993 | Japan . |

OTHER PUBLICATIONS

T. Hamada et al., "Plasma–Assisted Epitaxial Growth of p–Type ZnSe in Nitrogen–Based Plasma," Extended Abstracts of the 1992 International Conference on Solid–State Devices and Materials, Tsukuba, 1992, pp. 360–362.

T. Hamada, et al., "Plasma–assisted epitaxial growth of p–type ZnSe in nitrogen–based plasma." Extended Abstracts of the 1992 International Conference on Solid State Devices and Materials, 26–28 Aug. (abs. only).

S. Yamauchi, "The growth of ZnSe layers by plasma assisted epitaxy." Record of Electrical and Communication Engineering Conversazione, Tohoku Univ., Japan 1988. (abs. only).

J. Qiu, et al., "Recent developments in the MBE growth of wide bandgap II–VI semiconductors for laser diodes and LEDs." J. of Crystal Growth vol. 127, No. 1–4 (Apr. 1993) pp. 279–286.

S. Patnaik et al., "MOVPE of ZnSe using organometallic allyl selenium precursors." J. of Crystal Growth 107 (1991) pp. 390–395.

M. Konagai, "Wide bandgap II–VI compounds grown by MOMBE." J. of Crystal Growth 120 (1992) pp. 261–268.

*Primary Examiner*—Robert Kunemund
*Attorney, Agent, or Firm*—Antonelli, Terry, Stout & Kraus, LLP

[57] ABSTRACT

Disclosed is a process for producing p-type doped layers, in particular, in II-VI semiconductors, in which the p-type doped layer is produced in a CVD-step by means of plasma activation of nitrogenated gases.

5 Claims, 3 Drawing Sheets

PROCESS FOR PRODUCING P-TYPE DOPED LAYERS, IN PARTICULAR, IN II-VI SEMICONDUCTORS

This application is a Continuation of application Ser. No. 08/403,776, filed Apr. 11, 1995 now abandoned.

TECHNICAL FIELD

The present invention relates to a process for producing p-type doped layers, in particular, in II–VI semiconductors.

In a number of fields of application, it would be advantageous to be able to use semiconductor diodes that emit blue light.

By way of illustration, the use of semiconductor diodes that emit in the "blue range" would raise the storage density of the CD plates approximately by the factor 4. Furthermore, semiconductor diodes that emit blue light may find application in writing on writable/deletable optical memories.

STATE OF THE ART

By way of example, II–VI semiconductors ZnSe and ZnS having a band gap of 2.67 eV, respectively 3.66 eV at room temperature as well as ternary semiconductors such as e.g., ZnSSe are suited for producing light diodes that emit blue light. Semiconductors of this type require p-type doped layers.

Moreover, GaAs based optoelectronic circuits (OEIC) can be improved, i.a., with p-type doped ZnSe layers, by way of illustration, serving as a "current blocking layer" for lasers or as waveguides. The first optical circuits "SEED" (self electro optic effect devices) hitherto presented as demonstration models also require p-type doping.

In p-type doping, in particular, of ZnSe layers, but also other zinc-containing layers, difficulties crop up in industrial realization: P-type doping of ZnSe can take place by putting atoms of the group I such as Li or Na in a Zn position or by putting atoms of the group V, such as N, P or As in a Se position.

The hitherto achieved results are still receiving negative review in some surveys and critical articles:

With regard to this, reference is made to "Electrical properties of twinned ZnSe: p-type conductivity and chaos" by G. F. Neumark in Material Science Forum Vol. 38–41 (1989) 513–518, "Achievement of low resistivity p-type ZnSe and the role of twinning" by G. F. Neumark in J. Appl. Phys. 65 (12) (1989) 4859, or "Conductivity control of ZnSe-grown by MOVPE and its application for blue electroluminescence" by H. Kukimoto in J. of Crystal Growth 101 (1990) 953.

Furthermore, a number of attempts of doping with lithium have been reported, such as, e.g., by A. Yahata, H. Mitsuhashi, K. Hirahava in "Confirmation of p-type conduction in Li-doped ZnSe layers grown on GaAs-substrates" in the Jap. J. of Appl. Phys. 29 (1) (1990) L 4 or by H. Cheng, J. M. De Puydt, J. E. Potts, T. L. Smith "Growth of p-type ZnSe: Li by molecular beam epitaxy" in Appl. Phys. Lett. 52 (2) (1988) 147.

Optical measurements also show acceptor levels; on the other hand, high free hole concentrations larger than $8 \times 10^{16} cm^{-3}$ and low resistances were not found. The diffusion coefficient of lithium in ZnSe is very great, with electromigration being observed so that an application in components does not look promising. Concerning this reference, is made to "Electromigration in p-type ZnSe:Li" by M. A. Haase, J. M. De Puydt, H. Cheng, J. E. Potts in Appl. Phys. Lett. 58 (1991) 1173.

Although sodium has an activation energy of 124 meV in ZnSe, no conductivity that is usable for components has been observed, i.e., Na-doped ZnSe remains highly resistive, as was reported by T. Yodo, K. Veda, K. Morio, K. Yamashita, S. Tanaka in "Photoluminescence study of Li- and Na-implanted ZnSe epitaxial layers grown by atmospheric pressure metalorganic vapor-phase epitaxy", J. Appl. Phys. 68 (7) (1990) 3212 or by W. Stutius in "Growth and doping of ZnSe and $ZnS_xSe_{1-x}$ by organo-metallic chemical vapor deposition", J. of Crystal Growth 59 (1982) 1.

Likewise doping ZnSE with phosphor and arsenic usually yields high-resistive layers by generating deep traps. Concerning this, reference is made to H. Kukimoto's "Conductivity control of ZnSe-grown by MOVPE and its application for blue electroluminescence", J. of Crystal Growth 101 (1990) 953 or to W. Stutius', "Growth and doping of ZnSe and $ZnS_xSe_{1-x}$ by organo-metallic chemical vapor deposition", J. of Crystal Growth 59 (1982) 1.

On the other hand, doping ZnSe with nitrogen seems useful:

The layer structure of the blue-green laser diodes first published in September 1991 by M. A. Haase, J. Quium, J. M. De Puydt, H. Cheng in Appl. Phys. Lett. 59 (11) (1991). 1272 also has a nitrogen doping. The realization of this laser structure, which emits light at 490 nm, was not possible prior to the introduction of nitrogen doping with plasma activation in the MBE process.

In the aforementioned paper, $N_A-N_D$ dopings between $3*10^{17} cm^{-3}$ and $1*10^{18} cm^{-3}$ and specific resistances of 0.75 ohm cm were achieved. In addition, reference is made to "p-type ZnSe by nitrogen atom beam doping during molecular beam epitaxial growth", by R. M. Park, M. B. Troffer, C. M. Rouleaue in Appl. Phys. Lett. 57 (20) (1990) 2127.

Very early attempts of nitrogen doping were conducted with MOVPE processes (metal organic vapor phase epitaxy); for this, reference is made to "Nitrogen as shallow acceptor by organometallic chemical vapor deposition" by W. Stutius in Appl. Phys. Lett. 40 (3) (1982) 246–248 or "Nitrogen-doped p-type ZnSe films grown by MOVPE", by A. Ohki, M Shibata, K. Ando, A. Katsui in J. Crystal Growth 93 (1988) 692.

Lower resistances than $10^2$ ohm cm have, however, not been achieved. The reason for this is self-compensation due to deep traps. Theoretical calculations show that in a ZnSSe/ZnSe multilayer structure the activation of nitrogen can be improved by the factor 4–5 (S. Y. Ren, J. D. Dow, S. KLemm "strain-assisted p-type doping of II–VI semiconductors", J. Appl. Phys. 66 (5) (1989) 2065 or I. Suemune "Doping in a superlattice structure: improved hole activation in wide-gap II–VI materials", J. Appl. Phys. 67 (5) (1990) 2364). First improvements were experimentally proven in MOVPE structures as I. Suemune, H. Masato, K. Nakanishi, Y. Kuroda, M. Yamanishi reported in "Doping of nitrogen in ZnSe films: improved structures grown on GaAs by MOVPE" in J. Crystal Growth 107 (1991) 679.

Although, as was explained in the preceding, various different processes for p-type doping, in particular, of II–VI semiconductors have been investigated, none of the processes has proven satisfactory in practice.

DESCRIPTION OF THE INVENTION

The object of the present invention is to provide a process for producing p-type doped layers, in particular, in II–VI semiconductors permitting rapid and sure and, in particular, reproduceable production of p-type doped layers.

A solution to this object according to the present invention is set forth in claim 1. Further improvements of the present invention are the subject-matter of the subclaims.

An element of the present invention is that the p-type doped layer is produced in a CVD-step (chemical vapor deposition) by means of plasma activation of nitrogenated gases Preferably, the CVD process is conducted in a nitrogen carrier gas, with either a plasma in the nitrogen being spontaneously ignited or other nitrogenated compounds are additionally injected which are then activated by a plasma (claim 2).

The doping mechanism functions as follows: nitrogenated gases are decomposed by plasma activation and excited nitrogen radicals are generated. These nitrogen radicals are inserted into the surface of the growing semiconductor and result in doping with suitably high activation.

In particular, with the invented process, II/VI semiconductors, such as ZnSe, ZnS or ternary zinc containing semiconducting compounds, can be doped.

It is preferred if $N_2$, $N_2H_4$, $NH_3$ and other nitrogenated compounds are employed as the starting materials (claim 5).

The invented fundamental idea is universally applicable: the plasma doping can occur in MO (metal organic), MBE (molecular beam epitaxy) or MOCBE (metal organic chemical beam epitaxy) processes. Furthermore, the level of plasma doping can be varied by changing the temperature and/or the VI/II ratio as well as the plasma energy in order to influence the level of the doping.

BRIEF DESCRIPTION OF THE DRAWINGS

The present invention is described in the following, by way of example without the intention of limiting the scope or spirit of the overall inventive concept, using preferred embodiments with reference to the accompanying drawings to which, moreover, explicitly is referred for the disclosure of all inventive details not made more apparent herein. Depicted is in.

Figure 1:
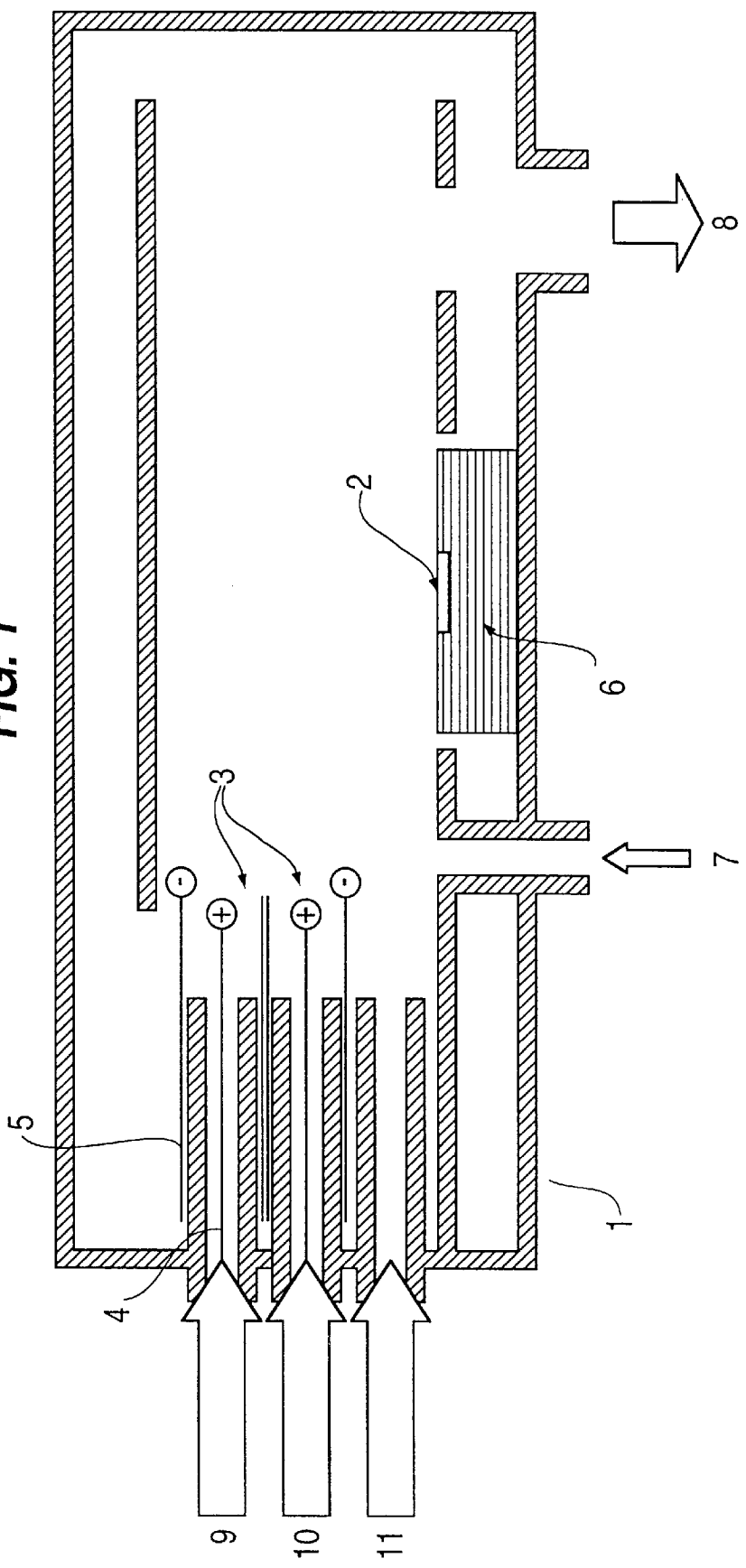
FIG. 1 a diagrammatic view of the plasma MOVPE reaction equipment.

(1) $T_D$=550° C. VI/II ratio=2,2 having water as the carrier gas and having plasma, 0.7 $\mu$m layer thickness.

(2) having nitrogen as the carrier gas, the thickness of the layer amounts to 0.3 $\mu$m.

(3) the same as in the first layer only that no plasma was employed for splitting the starting materials. The thickness is 0.7 $\mu$m.

(4) having nitrogen as the carrier gas and having a VI/II ratio of 0.9. The other parameters are the same as in layer (2).

(5) the parameters for the growth of the top layer as in the forth, however, with the difference of a reduced temperature of 440° C.

Thicknesss is again 0.3 $\mu$m.

BRIEF DESCRIPTION OF PREFERRED EMBODIMENTS

In the following figures, the same or the corresponding parts have the same numbering obviating renewed presentation and only deviations of the preferred embodiments from the first preferred embodiment shown in these figures are explained:

In order to let ZnSe (100) grow on GaAs-substrate, a horizontal low-pressure MOVPE reaction equipment (1) having a DC-plasma source (3) (direct current) was employed. The misorientation of the GaAs-substrate (2) lies at 2 per cent compared to the next <110> direction. The cathode (4) is composed of tantalum wire and the anode (5) is designed as a steel cylinder having a diameter of approximately 1 cm and a length of 1 cm. The anode (5) surrounds the tantalum wire. The distance between the receiver (6) on which the substrate is applied and the. plasma source is 10 cm.

The vapor pressure of the DASe (($H_2C$=CH-$CH_2$)$_2$Se) was measured. It is represented by the following equation: log(p)=9.6556—2636/T, with T standing for the temperature in Kelvin and p the pressure in hPa. This means that if the temperature is 18° C. the material has a vapor pressure of 4 hPa, which seems suited for the MOVPE process. The growth temperature was varied within a range of 320° to 600° C., with the overall pressure varying from 9.5 to 150 hPa. In this case, the VI/II ratio changes from 0.5 to 7.7 and the plasma output from 0 to 7W. The same was done for DEZn (diethyl zinc).

The carrier gas (7) may be composed of, e.g., $H_2$ or $N_2$ or nitrogen hydride compounds. The reference number 8 stands for the gas outlet. The reference numbers 9, 10 and 11 stand for the positions where the starting materials, such as selen, $N_2$ for doping, DEZ or other materials can be introduced or have been introduced.

Figure 2:
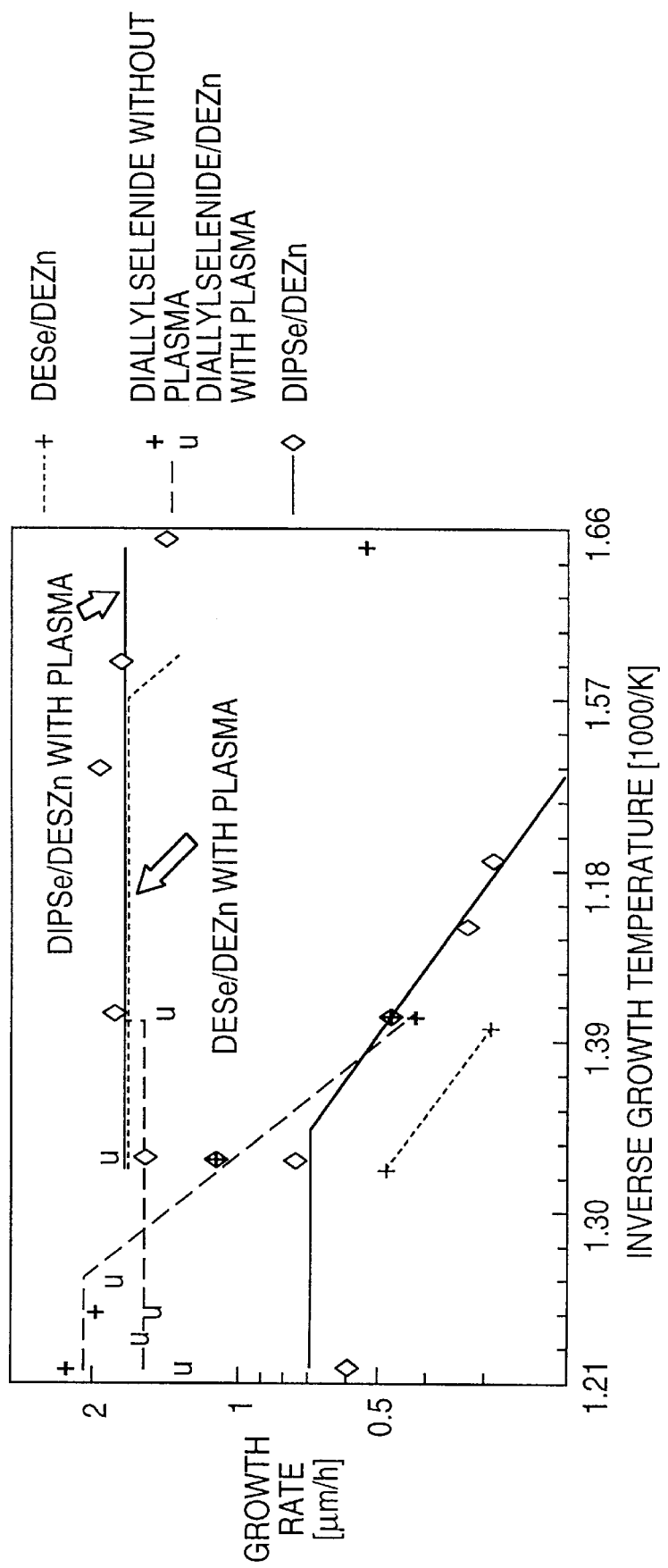
FIG. 2 comparison of the growth rates in various starting materials.

FIG. 2 shows the growth rates of various starting materials for the growth with and without plasma. The growth rates are given in $\mu$m/h, the inverse growth temperature in 1000/Kelvin.

Especially preferred in this example of an embodiment are starting material combinations for the growth of layers while employing plasma. This becomes clear due to the relative same-size growth rate for quite a large temperature range. Pointed out are output material combinations such as DESe (diethyl selenide) with DEZn, (diisopropyl selenide) (DIPSe) with DEZn and/or DEZn with diallyl selenide.

Figure 3A:
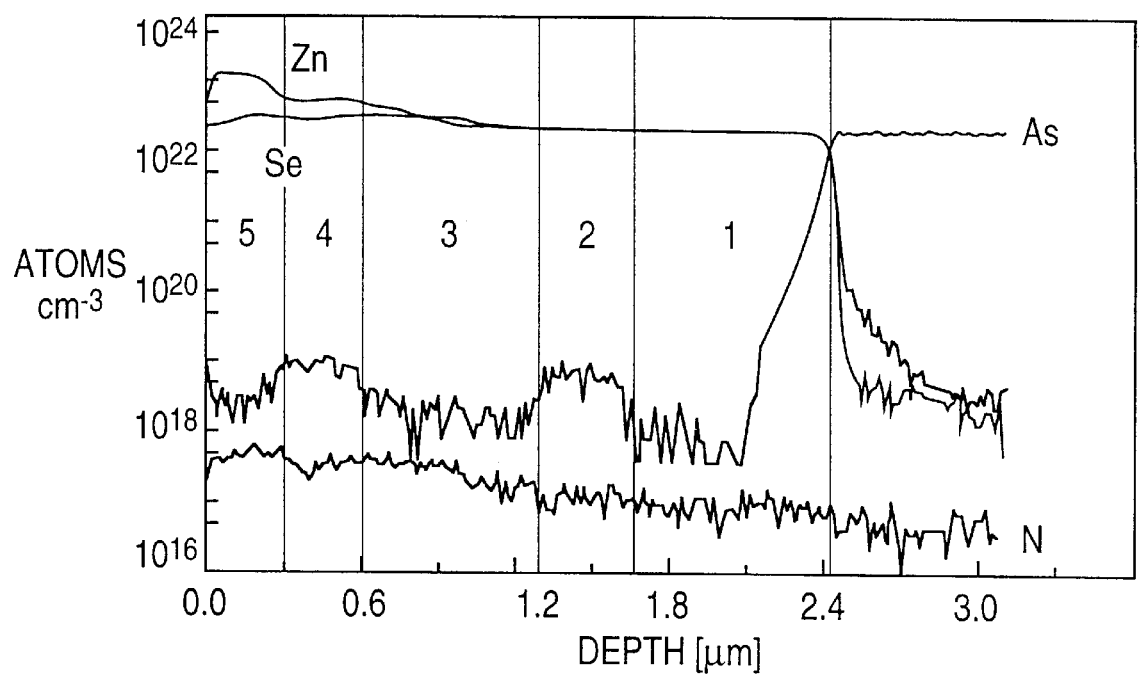
FIG. 3 SIMS measurements of a sample having the following sequence of layers.
Figure 3B:
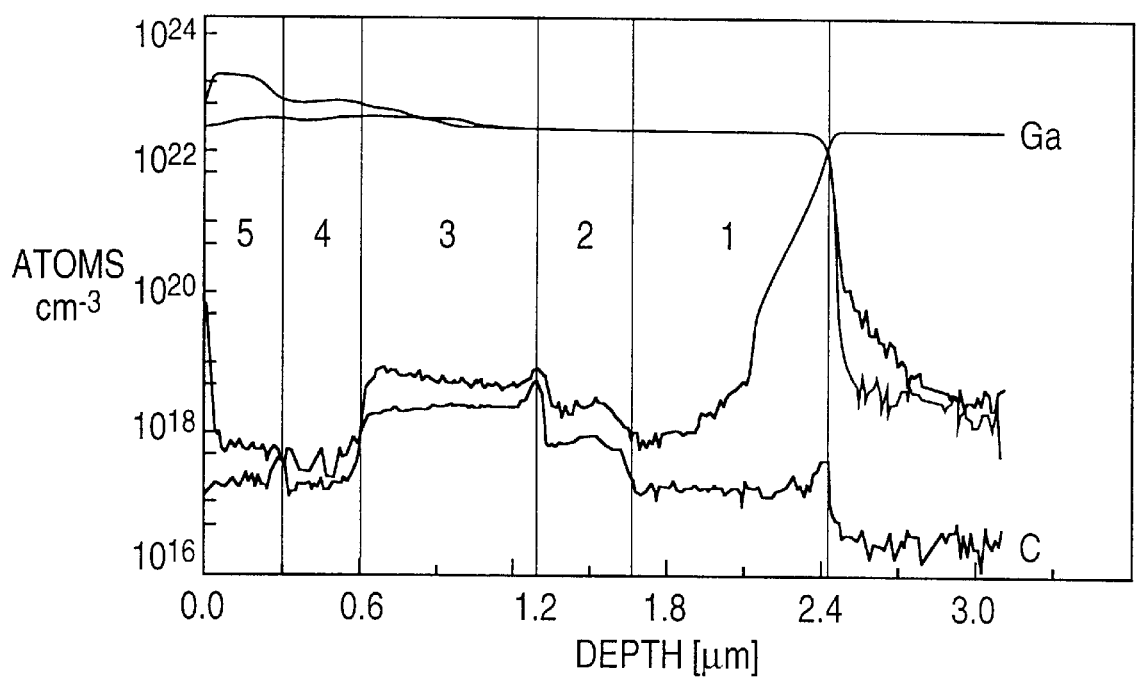

FIG. 3 shows SIMS measurements for a sample having five different layers which were grown at different growth parameters. The number of secondary atoms are given in $cm^{-3}$ and the depth in $\mu$m. Secondary ion mass spectra were made of Se, Zn, As, N, Ga and C. Distinctly discernable are the different atom concentrations in the different layers. Apparent is the advantage of a plasma-supported doping of nitrogen in the layers from a relatively small concentration of carbon and gallium as well as a higher concentration of nitrogen in relation to other materials.

In the preceding, the invention is described using preferred embodiments without any intention of limiting the scope or spirit of the overall inventive concept.

What is claimed is:

1. A process for the production of p-type doped II–VI semiconductor layers for use in blue emitting semiconductor devices by means of a CVD precipitation process, comprising forming a plasma in a gas comprising a carrier gas and metalorganic starting material compounds containing group II and group VI elements at a total pressure of 9.5 to 150 hPa, said carrier gas consisting of nitrogen, and depositing a II–VI semiconductor layer on a substrate, wherein the step of forming the plasma results in the formation of nitrogen radicals which settle in said II–VI semiconductor layer.

2. A process according to claim 1, characterized by said II–VI semiconductor layers containing ZnSe, ZnS or ternary zinc.

3. A process according to claim 1, characterized by the level of the plasma doping being varied by changing the temperature.

4. A process according to claim 1, characterized by the level of the plasma doping being varied by changing the VI/II ratio.

5. A process according to claim 1, characterized by the plasma energy being varied in order to influence the doping level.

* * * * *